(12) United States Patent
Kim et al.

(10) Patent No.: US 10,156,752 B2
(45) Date of Patent: Dec. 18, 2018

(54) BACKLIGHT UNIT AND METHOD OF MANUFACTURING THE SAME

(71) Applicant: Samsung Display Co., Ltd., Yongin, Gyeonggi-Do (KR)

(72) Inventors: Hyun-Jeong Kim, Hwaseong-si (KR); Hyuk-Hwan Kim, Hwaseong-si (KR); Seokhyun Nam, Seoul (KR); Si joon Song, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 843 days.

(21) Appl. No.: 14/599,630

(22) Filed: Jan. 19, 2015

(65) Prior Publication Data
US 2015/0261040 A1 Sep. 17, 2015

(30) Foreign Application Priority Data
Mar. 11, 2014 (KR) .................. 10-2014-0028448

(51) Int. Cl.
*G02F 1/1335* (2006.01)
*B23K 1/00* (2006.01)
(Continued)

(52) U.S. Cl.
CPC ...... *G02F 1/133603* (2013.01); *B23K 1/0016* (2013.01); *B23K 1/20* (2013.01); *B23K 3/0638* (2013.01); *B23K 3/08* (2013.01); *G02F 1/133606* (2013.01); *G02F 1/133611* (2013.01); *H05K 1/0274* (2013.01); *B23K 2201/38* (2013.01); *G02F 2001/133607* (2013.01); *H05K 1/181* (2013.01); *H05K 2201/09909* (2013.01);
(Continued)

(58) Field of Classification Search
CPC ........ G02F 1/133603; G02F 1/133606; G02F 1/133611; B23K 1/0016; B23K 1/20; B23K 3/0638; B23K 3/08; H05K 1/0274; H05K 2201/09909
USPC ....................................................... 362/97.1
See application file for complete search history.

(56) References Cited

U.S. PATENT DOCUMENTS 5,462,837 A * 10/1995 Yamaguchi ............. G03F 7/201
                                                              250/492.1
5,499,756 A *  3/1996 Banerji ................ B23K 1/0016
                                                              118/505
(Continued)

FOREIGN PATENT DOCUMENTS

KR    1020090078912 A    7/2009
KR      101037508 B1    5/2011
(Continued)

*Primary Examiner* — Bryon T Gyllstrom
(74) *Attorney, Agent, or Firm* — Cantor Colburn LLP

(57) ABSTRACT

A manufacturing method of a backlight unit includes providing a solder paste on a printed circuit board and forming a solder part in a first area of the printed circuit board, aligning a bank mask on the printed circuit board to align a first opening defined through the bank mask with a second area of the printed circuit board not overlapped with the first area, providing a bank material in the first opening and forming a bank on the printed circuit board in an area corresponding to the second area, separating the bank mask from the printed circuit board including the bank thereon, and connecting the solder part of the printed circuit board and a light emitting unit to each other.

13 Claims, 8 Drawing Sheets

(51) Int. Cl.
*B23K 1/20* (2006.01)
*B23K 3/06* (2006.01)
*B23K 3/08* (2006.01)
*H05K 1/02* (2006.01)
*B23K 101/38* (2006.01)
*H05K 1/18* (2006.01)

(52) U.S. Cl.
CPC .............. *H05K 2201/10106* (2013.01); *H05K 2201/2054* (2013.01)

(56) References Cited

U.S. PATENT DOCUMENTS

| | | | | |
|---|---|---|---|---|
| 6,001,537 | A * | 12/1999 | Ohsumi | H01L 21/31138 257/E21.039 |
| 6,428,189 | B1 * | 8/2002 | Hochstein | F21V 29/004 362/227 |
| 7,064,424 | B2 | 6/2006 | Wilson | |
| 2005/0087356 | A1 * | 4/2005 | Forcier | B81C 1/0023 174/558 |
| 2007/0080451 | A1 * | 4/2007 | Suh | B23K 1/20 257/737 |
| 2007/0145254 | A1 * | 6/2007 | Chen | H04N 5/2254 250/239 |
| 2009/0065242 | A1 * | 3/2009 | Sato | H05K 3/3452 174/255 |
| 2009/0268457 | A1 * | 10/2009 | Kim | H01L 33/58 362/235 |
| 2010/0027261 | A1 * | 2/2010 | Yashima | C09J 7/0282 362/249.02 |
| 2014/0131081 | A1 * | 5/2014 | Cho | H01L 21/563 174/258 |
| 2014/0183249 | A1 * | 7/2014 | Choi | B23K 1/0016 228/223 |
| 2015/0163903 | A1 * | 6/2015 | Wada | H05K 3/321 361/760 |

FOREIGN PATENT DOCUMENTS

| | | |
|---|---|---|
| KR | 1020120099962 A | 9/2012 |
| KR | 1020120127852 A | 11/2012 |
| KR | 1020130090644 A | 8/2013 |
| KR | 101306246 B1 | 9/2013 |

* cited by examiner

BACKLIGHT UNIT AND METHOD OF MANUFACTURING THE SAME

This application claims priority to Korean Patent Application No. 10-2014-0028448, filed on Mar. 11, 2014, and all the benefits accruing therefrom under 35 U.S.C. § 119, the contents of which are hereby incorporated by reference in its entirety.

BACKGROUND

1. Field

The invention relates to a backlight unit and a method of manufacturing the same. More particularly, the invention relates to a direct-illumination type backlight unit and a method of manufacturing the direct-illumination type backlight unit.

2. Description of the Related Art

A liquid crystal display includes a liquid crystal display panel to display an image, a backlight unit to provide light to the liquid crystal display panel, and a bottom chassis to accommodate the backlight unit.

The backlight unit is classified into an edge-illumination type backlight unit and a direct-illumination type backlight unit according to a position of a light source thereof. As the light source, a light emitting diode is widely used since the light emitting diode has many advantages, such as a relatively fast response, a solid-state device having no heavy metal, an environmental-friendly device compared to a cold cathode fluorescent lamp ("CCFL"), etc.

SUMMARY

One or more exemplary embodiment of the invention provides a backlight unit having uniform brightness.

One or more exemplary embodiment of the invention provides a manufacturing method of the backlight unit, which is capable of accomplishing mass production of the backlight unit at relatively low cost.

Exemplary embodiments of the invention provide a method of manufacturing a backlight unit, including providing a solder paste on a printed circuit board and forming a solder part in a first area of the printed circuit board, aligning a bank mask on the printed circuit board to align a first opening defined through the bank mask with a second area of the printed circuit board not overlapped with the first area, providing a bank material in the aligned first opening to form a bank on the printed circuit board in an area corresponding to the second area, separating the bank mask from the printed circuit board including the bank thereon, and connecting the solder part of the printed circuit board and a light emitting unit to each other.

The bank mask may be provided with a protective groove recessed from a lower surface thereof, and the solder part may be disposed in the protective groove by the aligning the bank mask.

The protective groove of the bank mask may have a depth larger than a thickness of the solder part.

The bank mask may have a thickness of about 100 micrometers to about 300 micrometers.

The bank may have a thickness of about 100 micrometers to about 300 micrometers.

The bank may be formed to surround the solder part in a plan view.

The bank mask may include a metal material.

The bank material may include at least one of silicon, acryl, polycarbonate, polyvinylchloride, epoxy-based resin and a combination thereof.

The forming the solder part may be performed by a screen printing method using a solder mask provided with a second opening defined therethrough to correspond to the first area of the printed circuit board.

The connecting the light emitting unit and the solder part may be performed by a reflow-soldering process.

The method may further include disposing a lens part on the printed circuit board to cover the light emitting unit and the bank.

Exemplary embodiments of the invention provide a backlight unit including a solder part on a printed circuit board, a light emitting diode package including a light emitting unit connected to the solder part and mounted on the printed circuit board and a lens part on the printed circuit board and covering the light emitting unit, and a bank on the printed circuit board, adjacent to a side surface of the light emitting unit, covered by the lens part and configured to change a path of a light exiting from the side surface of the light emitting unit such that the light travels to outside the lens part.

The bank may surround the light emitting unit in a plan view.

The bank may have a thickness of about 100 micrometers to about 300 micrometers.

The bank may include at least one of silicon, acryl, polycarbonate, polyvinylchloride, epoxy-based resin and a combination thereof.

The lens part may include an inner surface, an upper surface facing the inner surface, and a side surface connecting the inner surface and the upper surface to define a space in which the light emitting is disposed. The bank may be between the light emitting unit and the inner surface of the lens part.

The lens part may include an inner surface, an upper surface facing the inner surface, and a side surface connecting the inner surface and the upper surface to define a space in which the light emitting is disposed. The bank may be between the lens part inner surface and the lens part side surface.

Exemplary embodiments of the invention provide a screen printing method including providing a first material in a first area of a substrate and forming a first pattern at the first area of the substrate, aligning a mask on the substrate to align a protective groove defined extending from a lower surface of the mask to correspond to the first area, to align an opening defined through the mask to correspond to a second area of the substrate not overlapped with the first area on the substrate and to dispose the first pattern inside the protective groove, and providing a second material in the opening of the mask to form a second pattern on the second area of the substrate.

According to one or more exemplary embodiment of the invention, the path of the light exiting through the side surface of the light emitting unit is changed by the bank disposed adjacent to the side surface of the light emitting unit, such that the emitted light travels to outside the lens part of the light emitting unit through the lens part. Therefore, brightness uniformity of the backlight unit is improved, and thus a hot spot may be reduced or effectively prevented.

In addition, since the mask used to form the bank includes the protective groove recessed from the lower surface of the mask, damage to the solder part previously formed on the printed circuit board may be reduced or effectively prevented. Thus, although the bank is formed on the printed circuit board by the screen printing method after the solder part is formed on the printed circuit board, damage to the solder part may be reduced or effectively prevented. As a result, the manufacturing cost of the backlight unit is reduced and mass production of the backlight unit is accomplished.

BRIEF DESCRIPTION OF THE DRAWINGS

The above and other advantages of the invention will become readily apparent by reference to the following detailed description when considered in conjunction with the accompanying drawings wherein:

FIGS. 6A to 6G are views showing an exemplary embodiment of a method of manufacturing a backlight unit according to the.

DETAILED DESCRIPTION

Figure 1:
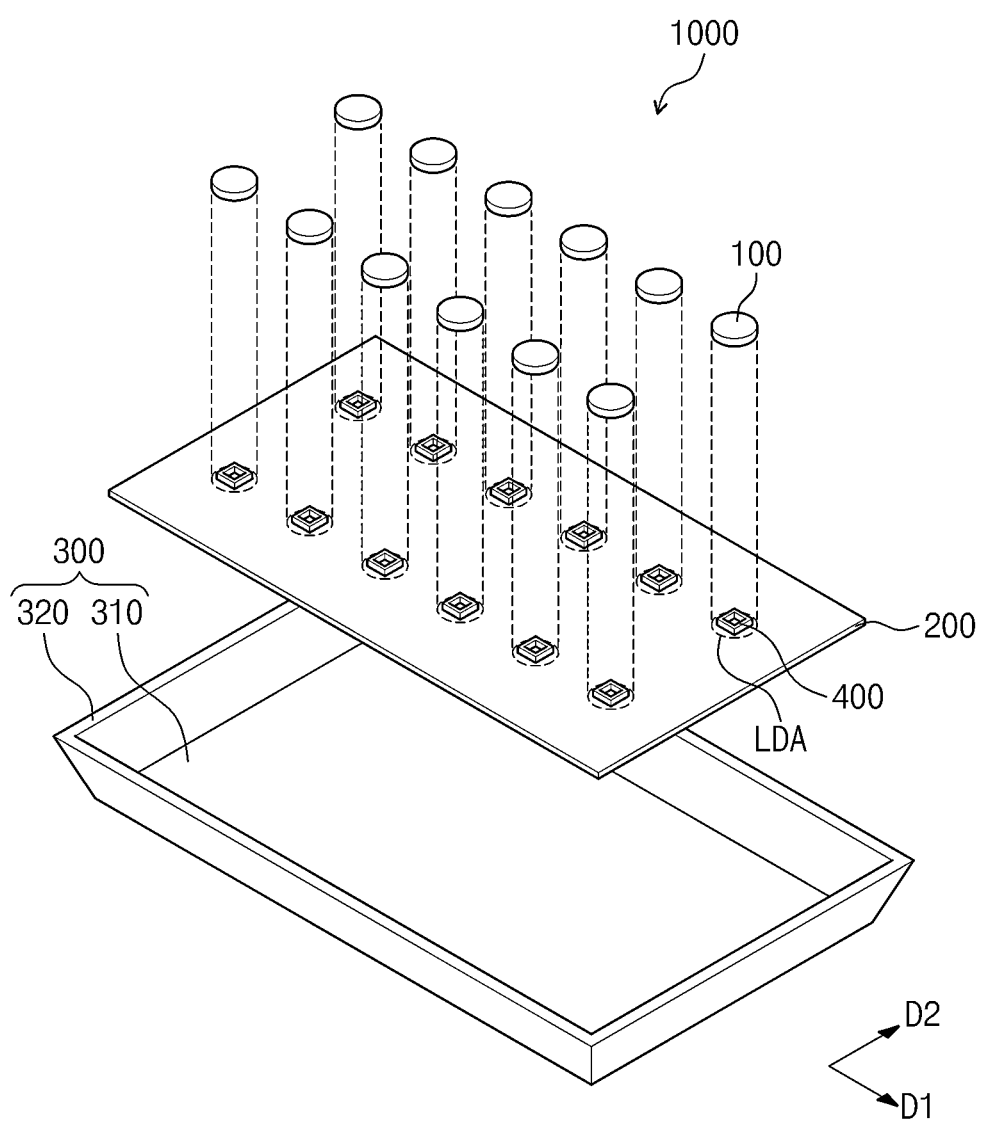
FIG. 1 is an exploded perspective view showing an exemplary embodiment of a backlight unit according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments a re provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, connected may refer to elements being physically and/or electrically connected to each other. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" with respect to other elements or features would then be oriented "upper" with respect to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

FIG. 1 is an exploded perspective view showing an exemplary embodiment of a backlight unit according to the invention.

Referring to FIG. 1, a backlight unit 1000 includes a light emitting diode package 100 configured to generate and emit a light, a printed circuit board 200 configured to drive the light emitting diode package 100, and a bottom chassis 300 configured to accommodate the light emitting diode package 100 and the printed circuit board 200 therein.

The bottom chassis 300 includes a bottom portion 310 on which the printed circuit board 200 is placed and a sidewall 320 extending from the bottom portion 310. The bottom portion 310 has a rectangular shape defined by two pairs of sides, which are substantially in parallel to a first direction D1, and a second direction D2 vertical to the first direction D1, respectively. The sidewall 320 extends upward from the two pairs of sides. As an example, the bottom chassis 300 includes a metal material, e.g., aluminum, but the invention is not limited thereto.

The printed circuit board 200 is disposed on the bottom portion 310 and has a rectangular shape to cover the bottom portion 310. The light emitting diode package 100 is provided in a plural number and the light emitting diode packages 100 are arranged on the printed circuit board 200 in a matrix form. The light emitting diode packages 100 are electrically connected to and driven by the printed circuit board 200 to generate and emit the light.

The backlight unit 1000 includes a bank 400 disposed on the printed circuit board 200. The bank 400 is provided in a plural number and the banks 400 are arranged in a matrix form to correspond to the light emitting diode packages 100 in a one-to-one correspondence. Each bank 400 is disposed in a light emitting diode area LDA covered by the light emitting diode package 100 and disposed between a lens part 120 (refer to FIG. 2) of a corresponding light emitting diode package 100 of the light emitting diode packages 100 and the printed circuit board 200.

Figure 2:
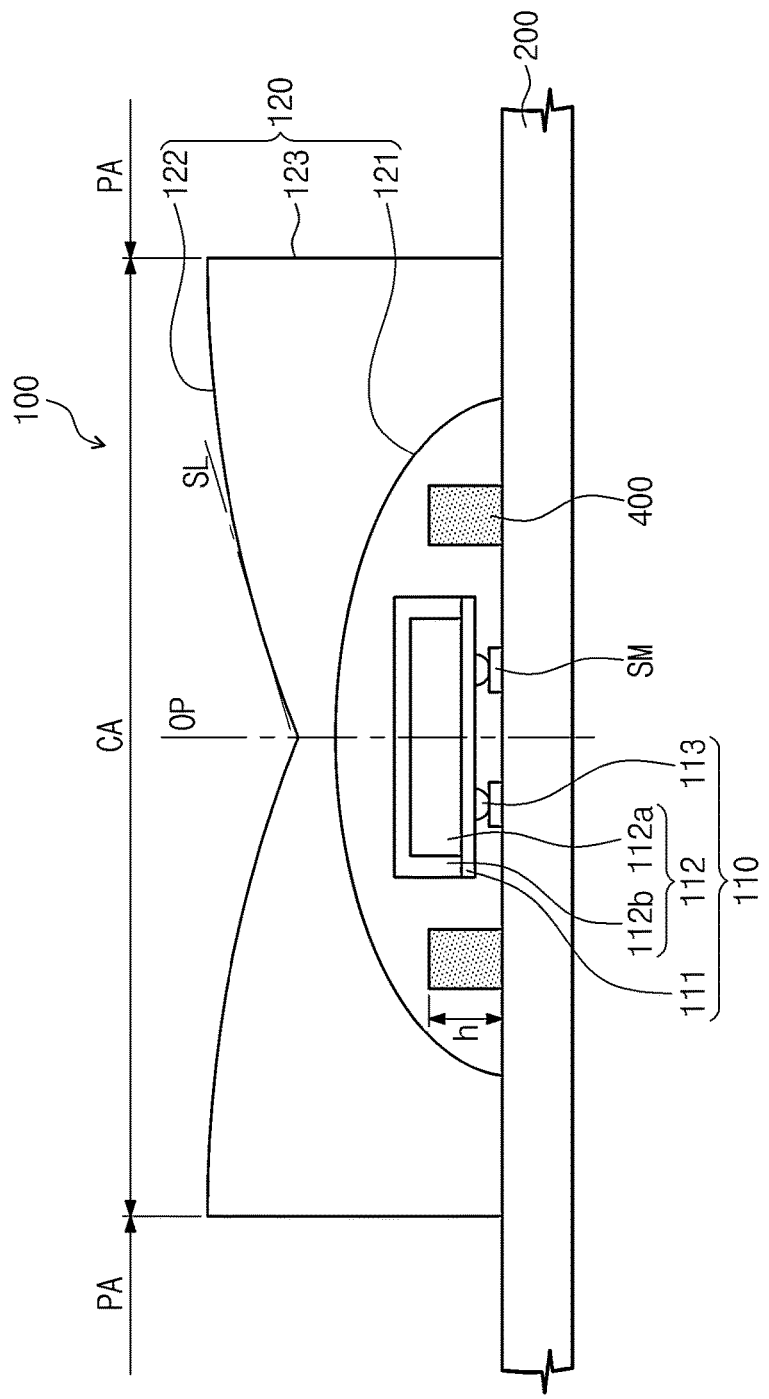
FIG. 2 is a cross-sectional view of an exemplary embodiment of a light emitting diode package shown in FIG. 1.
Figure 3:
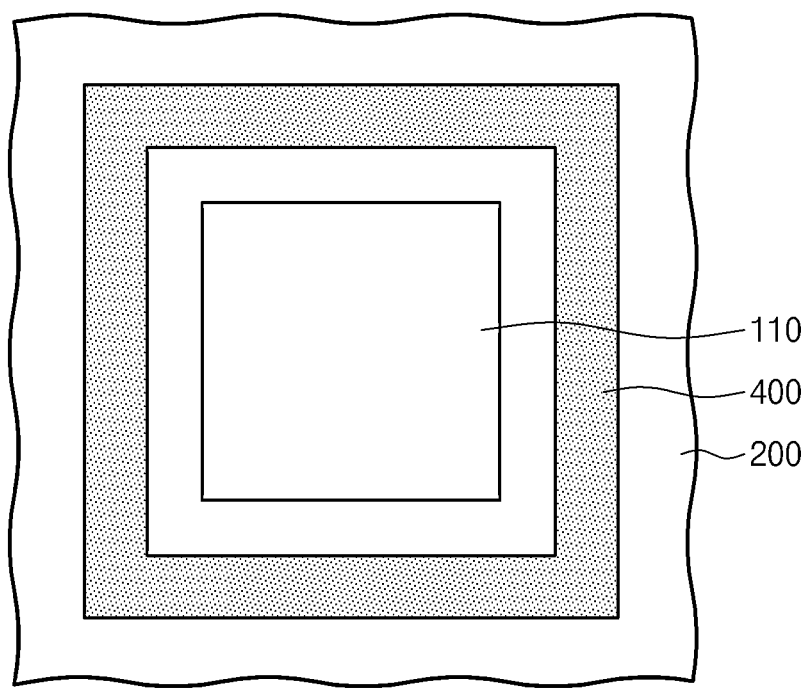
FIG. 3 is a plan view showing the light emitting diode package shown in FIG. 1.

FIG. 2 is a cross-sectional view of an exemplary embodiment of a light emitting diode package shown in FIG. 1 and FIG. 3 is a plan view showing the light emitting diode package shown in FIG. 1.

Referring to FIGS. 2 and 3, the light emitting diode package 100 includes a light emitting unit 110 configured to generate and emit the light and the lens part 120 configured to guide the light such that the light exits through a side surface thereof. The light emitting unit 110 includes a base substrate 111 that serves as a base of the light emitting unit 110, a light emitting part 112 configured to generate and emit the light, and a connection terminal 113 that electrically connects the light emitting part 112 and the printed circuit board 200 (refer to FIG. 1) to each other.

The light emitting part 112 includes a light emitting diode chip 112*a* and a fluorescent layer 112*b*. The light emitting diode chip 112*a* generates a blue light. The fluorescent layer 112*b* is disposed to cover the light emitting diode chip 112*a*. In an exemplary embodiment of manufacturing a light emitting diode package, for instance, the fluorescent layer 112*b* may be provided by a conformal coating process. Here, the fluorescent layer 112*b* includes a fluorescent substance combined with an insulating material, e.g., silicon-based resin, epoxy resin, etc., and is coated on an outer surface of the light emitting diode chip 112*a* at a substantially uniform thickness.

A portion of the blue light emitted from the light emitting diode chip 112*a* is absorbed by the fluorescent substance of the fluorescent layer 112*b* and excites the fluorescent substance, and thus the excited fluorescent substance generates a yellow light. The other portion such as a remaining portion of the blue light, which is not absorbed by the fluorescent substance, transmits through the fluorescent substance. The blue light transmitting through the fluorescent substance and the yellow light are mixed with each other to form a white light. The white light travels to the outside of the light emitting diode package 100 through the lens part 120.

The lens part 120 covers the light emitting part 112 and includes an inner surface 121, an upper surface 122 and a side surface 123. The inner surface 121 has a convex curved shape when viewed in a cross-sectional view and has a circular shape when viewed in a plan view. The inner surface 121 forms a space, in which the light emitting unit 110 and the bank 400 are disposed, with an upper surface of the base substrate 111.

The upper surface 122 of the lens part 120 has a symmetrical shape with respect to an imaginary line OP passing through a center of the light emitting diode package 100 and extending in a thickness direction of the light emitting diode package 100. The upper surface 122 is convex upwardly when viewed in a cross-sectional view and a tangent slope SL of the upper surface 122 is decreased as a distance from the center of the light emitting diode package 100 increases and a distance from the side surface 123 decreases. Although not shown in figures, the shape of the upper surface 122 should not be limited thereto or thereby. That is, the upper surface 122 may have a straight line shape, which is inclined with respect to the imaginary line OP at a predetermined angle. The side surface 123 extends from an edge of the upper surface 122 to the printed circuit board 200.

The light generated by the light emitting part 112 is incident to the lens part 120 through the inner surface 121 and guided by the upper surface 122, and then the light travels to the outside of the lens part 120 through the side surface 123. As described above, when the light exits through the side surface 123 of the lens part 120, the uniformity in brightness of the backlight unit 1000 may be improved.

The connection terminal 113 is electrically connected to the light emitting diode chip 112*a* and protruded from the base substrate 111 of the light emitting diode package 100 to the printed circuit board 200 (refer to FIG. 1). A solder part SM is disposed on the printed circuit board 200. The connection terminal 113 makes contact with the solder part SM to electrically connect the light emitting diode chip 112*a* to the printed circuit board 200. Accordingly, the light emitting diode chip 112*a* receives a source voltage from the printed circuit board 200 through the connection terminal 113 and generates the light.

The bank 400 is protruded upward from the upper surface of the printed circuit board 200 and surrounds the light emitting part 112 in the plan view. The bank 400 has a height h of about 100 micrometers to about 300 micrometers.

As shown in FIG. 3, the light emitting unit 110 collectively has a substantially rectangular shape with four sides. In the illustrated exemplary embodiment, the bank 400 includes first, second, third and fourth bank segments, each of which is spaced apart from a corresponding side of the four sides of the light emitting unit 110 by a predetermined distance and extends substantially in parallel to the corresponding side of the four sides. End portions of each of the first to fourth bank segments are connected to end portions of bank segments adjacent thereto. However, the shape of the bank 400 should not be limited thereto or thereby. In an alternative exemplary embodiment, for instance, the bank 400 may have a shape to partially surround the light emitting unit 110 or a ring shape to totally surround the light emitting unit 110.

When the backlight unit 1000 does not include the bank 400, a portion of the light traveling to the side surface 123 of the lens part 120 from the light emitting part 112 is reflected by the inner surface 121 and exits through the upper surface 122 of the lens part 120 after being condensed to the upper surface 122. In addition, another portion of the light traveling to the side surface 123, such as a remaining portion, is totally reflected within the lens part 120 after passing through the inner surface 121, and then exits through the upper surface 122 of the lens part 120 after being condensed to the upper surface 122. Accordingly, the brightness becomes relatively high in a center area CA of the light emitting diode package 100 corresponding to an upper portion of the light emitting diode package 100 and the brightness becomes relatively low in a peripheral area PA of the light emitting diode package 100 disposed adjacent to the center portion CA, and thus a hot spot phenomenon occurs. As a result, the brightness uniformity of the backlight unit 1000 may be deteriorated.

However, as described above, when the backlight unit 1000 includes the bank 400, the light traveling to the side surface 123 of the lens part 120 is reflected and/or scattered by the bank 400. Therefore, the amount of the light reflected by the lens part 120, condensed to the upper surface 122 of the lens part 120, and exiting through the upper surface 122 is reduced, and thus the hot spot phenomenon is reduced or effectively prevented. As a result, the brightness uniformity of the backlight unit is improved. In other words, a difference in brightness between the center portion CA and the peripheral area PA of the light emitting diode package 100 is reduced.

Figure 4A:
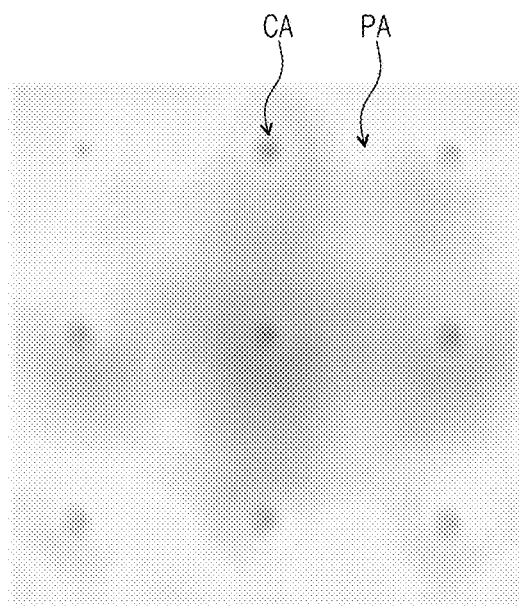
FIG. 4A is a simulated image showing a display characteristic of a comparative example of a backlight unit according to the invention.
Figure 4B:
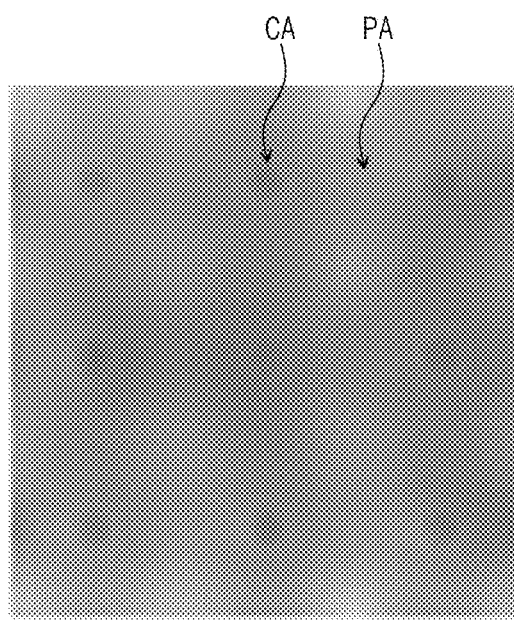
FIG. 4B is a simulated image showing a display characteristic of an exemplary embodiment of a backlight unit according to the invention.

FIG. 4A is a simulated image showing a display characteristic of a comparative example of a backlight unit according to the invention and FIG. 4B is a simulated image showing a display characteristic of an exemplary embodiment of a backlight unit according to the invention.

In FIGS. 4A and 4B, a contrast difference between the images means a brightness difference. The comparative example of the backlight unit according to the invention does not include the bank 400 and the exemplary embodiment of the backlight unit according to the invention includes the bank 400. The bank 400 of the exemplary embodiment of the backlight unit according to the invention has a cross-section thickness of about 260 micrometers.

As shown in FIG. 4A, since the comparative example of the backlight unit according to the invention does not include the bank 400, the difference in brightness between the center area CA and the peripheral area PA becomes relatively large. Thus, a hot spot occurs in the center portion related to the center area CA of the light emitting diode package 100. In contrast, the brightness difference between the center area CA and the peripheral area PA becomes relatively small by including the bank 400 in the exemplary embodiment of the backlight unit according to the invention as shown in FIG. 4B, and thus the hot spot does not occur as shown in FIG. 4B. Accordingly, the brightness uniformity of the exemplary embodiment of the backlight unit is improved.

Figure 5:
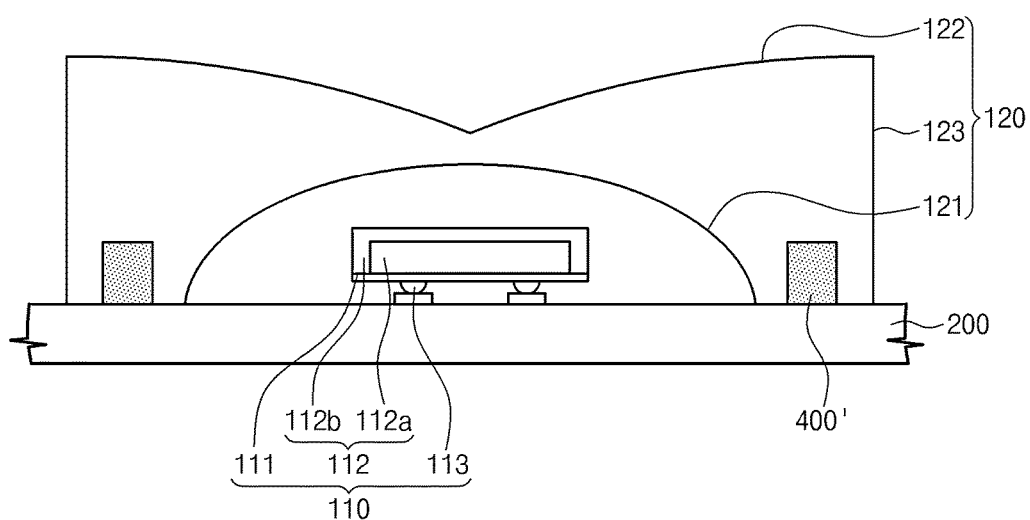
FIG. 5 is a cross-sectional view showing another exemplary embodiment of a backlight unit according to the invention.

FIG. 5 is a cross-sectional view showing another exemplary embodiment of a backlight unit according to the invention.

Referring to FIG. 5, a bank 400' is disposed in the lens part 120. In detail, the bank 400' may be disposed between the inner surface 121 and the side surface 123 of the lens part 120, that is, within the lens part 120. In contrast, referring to FIG. 2, the bank 400 is disposed outside the lens part 120.

FIGS. 6A to 6G are views showing an exemplary embodiment of a method of manufacturing a backlight unit according to the invention. According to FIGS. 6A to 6G, the backlight unit 1000 may be manufactured by a screen printing method, but the invention is not limited thereto.

Figure 6A:
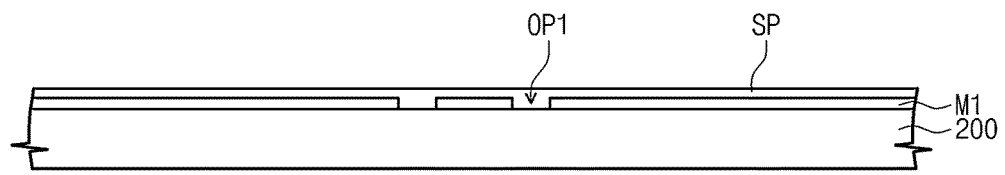

Referring to FIG. 6A, a solder mask M1 is disposed on the printed circuit board 200. A lower surface of the solder mask M1 makes contact with an upper surface of the printed circuit board 200. The solder mask M1 is provided with a first opening OP1 formed therethrough. In the illustrated exemplary embodiment, the solder mask M1 includes two first openings OP1 spaced apart from each other, but the invention is not limited thereto. A solder paste SP including a conductive material is coated on the solder mask M1. Referring to FIG. 6A, the solder paste SP is provided on an upper surface of the solder mask M1 and on the printed circuit board 200 exposed through the first openings OP1 defined in the solder mask M1.

Figure 6B:
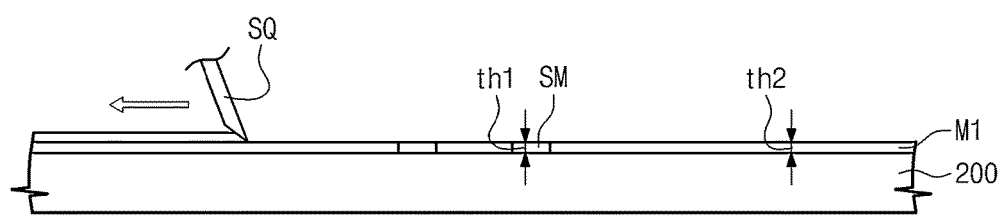

Referring to FIG. 6B, a portion of the solder paste SP coated on the solder mask M1 is removed such as using a squeezer SQ that moves along the upper surface of the solder mask M1. Accordingly, a portion of the solder paste SP is removed from the upper surface of the solder mask M1, and a solder part SM is formed in the first openings OP1 from a remaining portion of the solder paste SP. The solder part SM has a shape corresponding to the first opening OP1. The solder part SM has a first thickness th1 substantially the same as a second thickness th2 of the solder mask M1. Therefore, the first thickness th1 of the solder part SM is determined by the second thickness th2 of the solder mask M1.

Then, the solder mask M1 is separated from the printed circuit board 200.

Figure 6C:
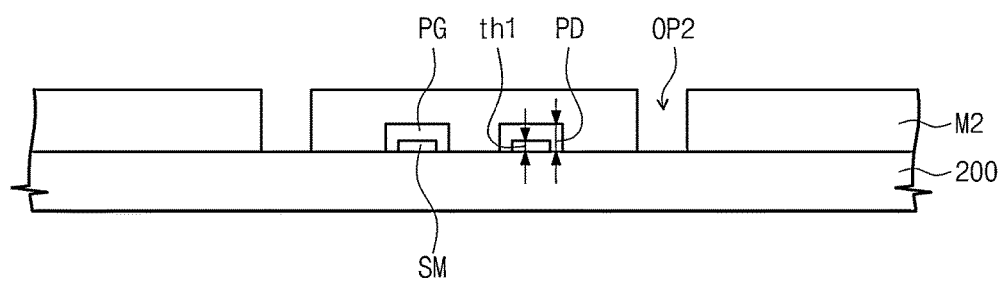

Referring to FIG. 6C, a bank mask M2 is disposed on the printed circuit board 200 including the solder part SM thereon. A lower surface of the bank mask M2 makes contact with the upper surface of the printed circuit board 200. The bank mask M2 includes a protective groove PG and a second opening OP2 defined therein. The protective groove PG is formed in the lower surface of the bank mask M2. In more detail, the protective groove PG is formed by a recess extending upward from the lower surface of the bank mask M2 in a cross-sectional view. The protective groove PG has a depth PD larger than the first thickness th1 of the solder part SM. The protective groove PG is formed to correspond to the solder part SM and has an area wider than that of the solder part SM in a plan view, such as in a top plan view.

Referring again to FIG. 6C, the bank mask M2 is disposed on the printed circuit board 200 such that the solder part SM is disposed inside the protective groove PG. Thus, although the lower surface of the bank mask M2 makes contact with the upper surface of the printed circuit board 200, the solder part SM does not make contact with the bank mask M2. Accordingly, damage to the solder part SM due to the bank mask M2 may be reduced or effectively prevented.

The bank mask M2 includes the second opening OP2 defined therein. In the illustrated exemplary embodiment, the bank mask M2 includes two second openings OP2 spaced apart from each other such that the first opening OP1 of the solder mask M1 is disposed between the second openings OP2.

Figure 6D:
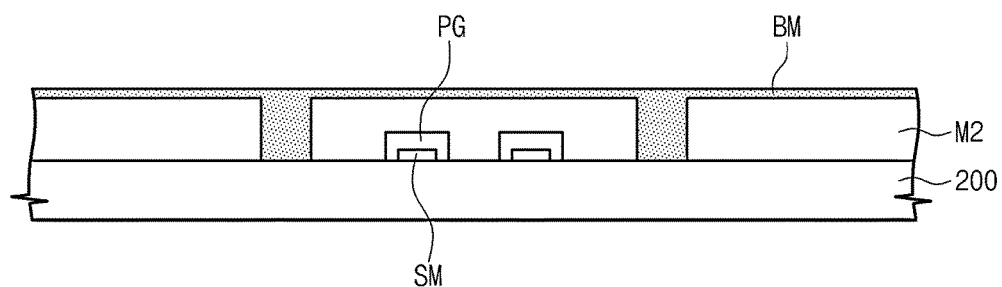

Referring FIG. 6D, a bank material BM is coated on the bank mask M2 including the second opening OP2 defined therein. The bank material BM is disposed on an upper surface of the bank mask M2 and on the printed circuit board 200 exposed through the second openings OP2. The bank material BM includes a material that reflects the light. In an exemplary embodiment, for instance, the bank material BM includes at least one of silicon, acryl, polycarbonate, polyvinylchloride, epoxy-based resin and a combination thereof.

Figure 6E:
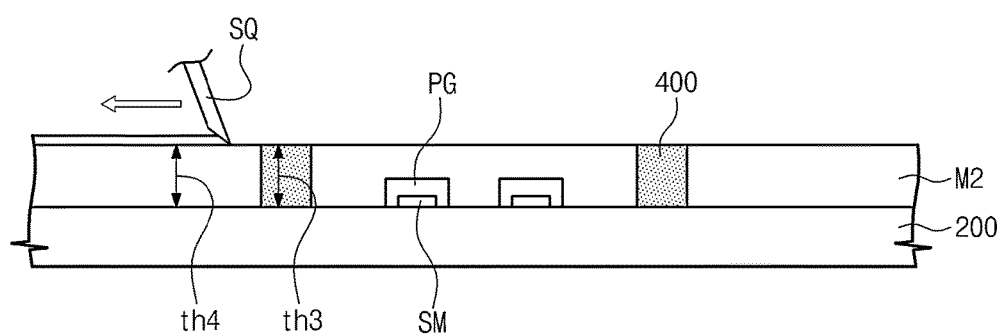

Referring to FIG. 6E, the bank material BM coated on the bank mask M2 is pushed out (e.g., partially removed) by the squeezer SQ that moves along the upper surface of the bank mask M2. Accordingly, a portion of the bank material BM is removed from the upper surface of the bank mask M2, and the bank 400 is formed in the second openings OP2 by a remaining portion of the bank material BM. In a plan view, the bank 400 is formed to surround the solder part SM. The bank 400 has a shape corresponding to the second opening OP2. The bank 400 has a third thickness th3 equal to a fourth thickness th4 of the bank mask M2. Therefore, the third thickness th3 of the bank 400 is determined by the fourth thickness th4 of the bank mask M2.

Figure 6F:
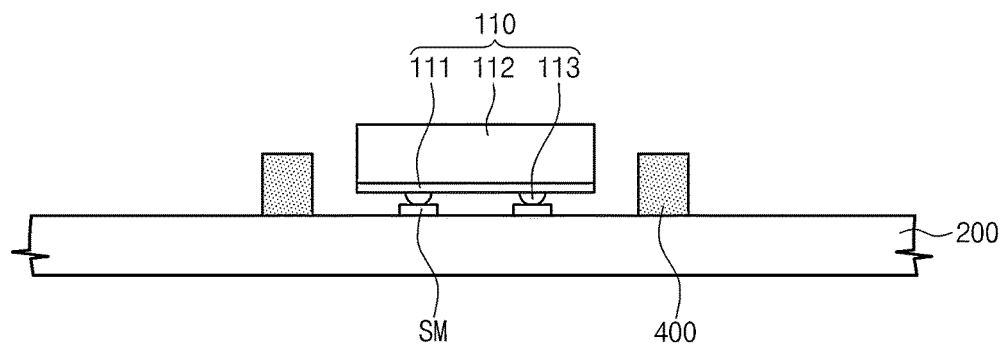

Then, as shown in FIG. 6F, the bank mask M2 is separated from the printed circuit board 200, and the light emitting unit 110 is mounted on the printed circuit board 200 by using a surface mount technology. The bank mask M2 is formed of a metal material, and thus the bank mask M2 is easily separated from the bank material BM. Then, the connection terminal 113 of the light emitting unit 110 electrically connected to the light emitting part 112 makes contact with the solder part SM, and the connection terminal 113 and the solder part SM are reflow-soldered with each other. Thus, the connection terminal 113 of the light emitting unit 110 is electrically connected to the solder part SM and the light emitting part 112 of the light emitting unit 110 is electrically connected to the printed circuit board 200 through the connection terminal 113.

Figure 6G:
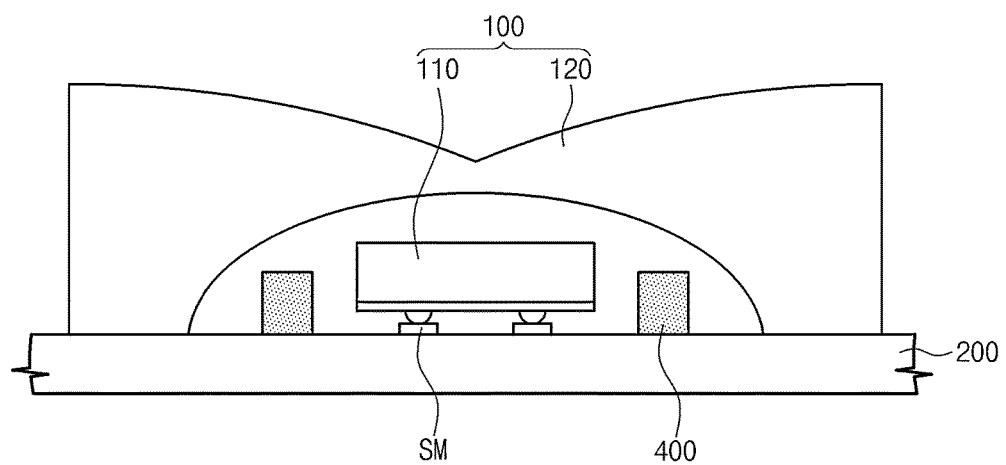

Referring to FIG. 6G, the lens part 120 is disposed on the printed circuit board 200 such that the light emitting unit 110 and the bank 400 are disposed outside the lens part 120, but the invention is not limited thereto. Referring to FIG. 5, the bank 400 may be disposed within the lens part 120.

As described above, when the bank 400 is formed using the bank mask M2 in which the protective recess PG is formed, even though the bank 400 is formed on the printed circuit board 200 by a screen printing method after the solder part SM is formed, damage to the solder part SM may be reduced or effectively prevented. Accordingly, mass production of the backlight unit including the bank 400 may be accomplished by the screen printing method, and thus the manufacturing cost of the backlight unit may be reduced.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A method of manufacturing a backlight unit, comprising:
    providing a solder paste on a printed circuit board, and forming a solder part in a first area of the printed circuit board;
    aligning a bank mask on the printed circuit board including the solder part thereon, to align a first opening defined through the bank mask with a second area of the printed circuit board not overlapped with the first area;
    providing a bank material on the bank mask, the bank material:
        extending into the aligned first opening of the bank mask to form a bank on the printed circuit board in an area corresponding to the second area, and
        maintained spaced apart from the solder part in the first area of the printed circuit board, by the bank mask;
    separating the bank mask from the printed circuit board including the bank thereon; and
    connecting the solder part of the printed circuit board and a light emitting unit to each other.

2. The method of claim 1, wherein
    a protective groove is further defined in the bank mask and recessed from a lower surface of the bank mask, and
    before the providing the bank material on the bank mask, the aligning the bank mask comprises disposing the solder part in the protective groove of the bank mask.

3. The method of claim 2, wherein the protective groove of the bank mask has a depth larger than a thickness of the solder part.

4. The method of claim 1, wherein the bank mask has a thickness of about 100 micrometers to about 300 micrometers.

5. The method of claim 4, wherein the bank has a thickness of about 100 micrometers to about 300 micrometers.

6. The method of claim 1, wherein the bank is formed to surround the solder part in a plan view.

7. The method of claim 1, wherein the bank mask comprises a metal material.

8. The method of claim 1, wherein the bank material comprises at least one of silicon, acryl, polycarbonate, polyvinylchloride, epoxy-based resin and a combination thereof.

9. The method of claim 1, wherein the forming the solder part is performed by a screen printing method using a solder mask provided with a second opening defined therethrough to correspond to the first area of the printed circuit board.

10. The method of claim 1, wherein the connecting the light emitting unit and the solder part to each other, is performed by a reflow-soldering process.

11. The method of claim 1, further comprising disposing a lens part on the printed circuit board to cover the light emitting unit and the bank.

12. A screen printing method comprising:
    providing a first material in a first area of a substrate, and forming a first pattern at the first area of the substrate;
    aligning a mask on the substrate,
        to align a protective groove defined extending from a lower surface of the mask, to correspond to the first area of the substrate, and
        to align an opening defined through the mask, to correspond to a second area of the substrate not overlapped with the first area, and
        to dispose the first pattern inside the protective groove; and
    providing a second material on the mask, the second material:
        extending into the opening of the mask, to form a second pattern on the second area of the substrate, and
        maintained spaced apart from the first pattern at the first area of the substrate, by the mask.

13. The screen printing method of claim 12, wherein the second material is provided in the opening of the mask after the forming the first pattern at the first area of the substrate.

* * * * *